United States Patent
Ghosh et al.

(10) Patent No.: US 11,762,408 B1
(45) Date of Patent: Sep. 19, 2023

(54) METHODS AND SYSTEMS FOR SELECTING VOLTAGE FOR A SUBSTRATE CONNECTION OF A BYPASS SWITCH

(71) Applicant: Samsung Electronics Co., Ltd., Suwon-si (KR)

(72) Inventors: Ankur Ghosh, Bengaluru (IN); Praveen Rathee, Bengaluru (IN); Sumanth Chakkirala, Bengaluru (IN); Tamal Das, Bengaluru (IN)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/829,690

(22) Filed: Jun. 1, 2022

(30) Foreign Application Priority Data

Apr. 6, 2022 (IN) .............................. 202241020736

(51) Int. Cl.
*G05F 1/46* (2006.01)
*G05F 1/56* (2006.01)
*H03K 19/0175* (2006.01)

(52) U.S. Cl.
CPC ....... *G05F 1/56* (2013.01); *H03K 19/017509* (2013.01)

(58) Field of Classification Search
None
See application file for complete search history.

(56) References Cited

U.S. PATENT DOCUMENTS

| 6,313,695 | B1* | 11/2001 | Ooishi | G11C 5/144 326/82 |
| 7,265,605 | B1* | 9/2007 | Vasudevan | G05F 1/56 327/534 |
| 7,271,640 | B2 | 9/2007 | Bargroff | |
| 7,701,245 | B1* | 4/2010 | Vasudevan | H03K 19/173 327/544 |
| 7,719,242 | B2* | 5/2010 | Negoro | G05F 1/46 323/276 |
| 7,868,605 | B1* | 1/2011 | Liu | G11C 5/147 323/284 |
| 8,080,983 | B2 | 12/2011 | Lourens et al. | |
| 8,947,156 | B2 | 2/2015 | Stultz et al. | |
| 9,098,101 | B2* | 8/2015 | Naidu | G06F 1/28 |
| 9,625,926 | B1* | 4/2017 | Hoque | G05F 1/569 |
| 10,509,426 | B2 | 12/2019 | Ganesan et al. | |
| 10,756,628 | B2* | 8/2020 | Cuenca | H02M 3/156 |
| 2015/0108842 | A1* | 4/2015 | Chen | H02J 1/10 307/52 |

* cited by examiner

*Primary Examiner* — Thomas J. Hiltunen
(74) *Attorney, Agent, or Firm* — Myers Bigel, P.A.

(57) ABSTRACT

Methods and systems for selecting voltage for a substrate connection of a bypass switch include a bulk voltage generation circuit coupled externally to the regulator. The bulk voltage generation circuit is configured to control selection of a voltage from among an Input/Output (I/O) supply voltage and a core supply voltage for a substrate connection of a bypass switch of the regulator. The bulk voltage generation circuit is configured to select the voltage for the substrate connection of the bypass switch based on a mode of operation of the regulator and at least one of a presence or an arrival sequence of the I/O supply voltage and the core supply voltage.

20 Claims, 12 Drawing Sheets

METHODS AND SYSTEMS FOR SELECTING VOLTAGE FOR A SUBSTRATE CONNECTION OF A BYPASS SWITCH

CROSS-REFERENCE TO RELATED APPLICATION

This application is based on and claims priority under 35 U.S.C. § 119 to Indian Patent Application No. 202241020736, filed on Apr. 6, 2022, the disclosure of which is incorporated by reference herein in its entirety.

FIELD

The present disclosure relates to the field of regulators, and more particularly to a bypass switch of a regulator for leakage control and overvoltage protection.

BACKGROUND

In general, regulators (such as voltage regulators) are used in an integrated circuit for producing clean internal supplies for meeting jitter spec of timing blocks. The regulators can produce an intermediate supply between an Input/Output (I/O) supply voltage and a core supply voltage with less ripple. To enable the regulator fail safe and also to have a low power mode with the relaxed jitter spec, a bypass switch may be added in the regulator to force the core supply voltage at an output voltage of the regulator (referred as a regulator output voltage).

In some existing approaches, the bypass switch is implemented as a thick gate device with a substrate connected to the I/O supply voltage. However, due to a supply sequencing (i.e., when the core supply voltage is present and the I/O supply has not arrived/come up), there may be relatively high cross supply current from a core supply to an I/O supply. Thus, such a fixed substrate connection with the I/O supply voltage may not be suitable. Also, the thick gate device with similar resistance may require larger area (for example: 4× area) of a thin gate device (in a 14 nm technology).

In some of the existing approaches, the thin gate device may be used for the implementation of the bypass switch. However, in such a scenario also, the fixed substrate connection with the core supply voltage may not be possible. Further, the substrate of the bypass switch implemented by the thin gate device may not be connected with the I/O supply voltage due to reliability issues. The reliability issues may occur due to high voltage stress on the thin gate device (which may be configured to withstand the core supply voltage between its terminals) and due to a cross supply current when the I/O supply voltage is not available. Also, the core supply voltage may not be used for the substrate of the bypass switch due to relatively high leakage during normal operation, when the regulator output voltage (for example ~200 milliVolt (mV)) is higher than the core supply voltage in some corner cases.

As the core supply voltage and the regulator output voltage are close, and both may vary independently, neither of the core supply voltage nor the regulator output voltage may be used reliably as the substrate connection across PVT, otherwise there may be high leakage current. Also, when the regulator is powered down, the regulator output voltage becomes zero. Thus, the available supply voltages may not be feasible for the substrate connection of the bypass switch without affecting reliability and/or leakage of the bypass switch.

SUMMARY

Embodiments herein are directed to methods and systems for selecting a voltage for a substrate connection of a bypass switch of a regulator for leakage control and overvoltage protection.

Embodiments herein are also directed to methods and systems for selecting the voltage from supply voltages for the substrate connection of the bypass switch based on a mode of operation of the regulator and at least one of a presence or an arrival sequence of the supply voltages.

Accordingly, embodiments herein include an integrated circuit comprising a regulator with a bypass switch, and a bulk voltage generation circuit coupled to the regulator. The bulk voltage generation circuit is configured to select, among a plurality of supply voltages, a voltage for a substrate connection of the bypass switch based on a mode of operation of the regulator and at least one of a presence or an arrival sequence of the supply voltages.

Accordingly, embodiments herein include a method for selecting voltage for a substrate connection of a bypass switch in a regulator. The method includes selecting, by a bulk voltage generation circuit coupled to the regulator, a voltage from among a plurality of supply voltages for the substrate connection of the bypass switch based on a mode of operation of the regulator and at least one of a presence or an arrival sequence of the supply voltages.

Accordingly, embodiments herein include an integrated circuit comprising a regulator comprising a bypass switch having a substrate connection, and a bulk voltage generation circuit coupled to the regulator. The bulk voltage generation circuit is configured to select, among a plurality of supply voltages, a higher voltage for the substrate connection of the bypass switch responsive to detecting a presence of the higher voltage and an active mode of operation of the regulator.

These and/or other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and the example embodiments herein include all such modifications.

BRIEF DESCRIPTION OF THE DRAWINGS

Embodiments herein are illustrated in the accompanying drawings, throughout which like reference letters indicate corresponding parts in the various figures. The embodiments herein will be better understood from the following description with reference to the drawings, in which.

DETAILED DESCRIPTION

Figure 1:
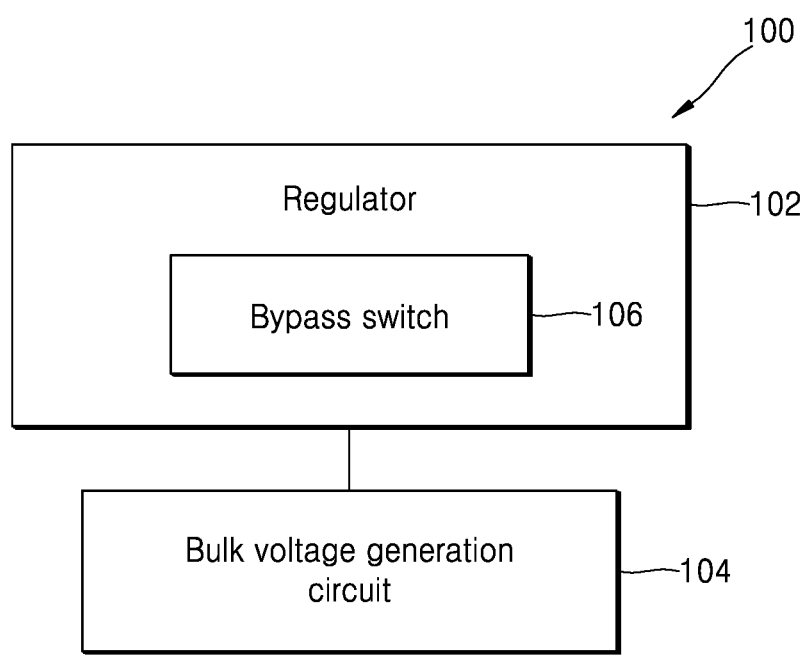
FIG. 1 depicts an integrated circuit, according to embodiments as disclosed herein.

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein.

Embodiments herein disclose a bulk voltage generation circuit for selecting a voltage for a bypass switch of a regulator. The bulk voltage generation circuit is configured to detect a mode of a regulator, check whether all power supplies are up and accordingly assign or apply a voltage for substrate connection for the bypass switch of the regulator, thereby meeting reliability and reducing leakage of the bypass switch.

Referring now to the drawings, and more particularly to FIGS. 1 through 10, where similar reference characters denote corresponding features consistently throughout the figures, there are shown example embodiments.

FIG. 1 depicts an integrated circuit 100, according to embodiments as disclosed herein.

The integrated circuit 100 includes a regulator 102, and a bulk voltage generation circuit 104. According to some example embodiments, the integrated circuit 100 may include a memory, which stores a control logic that controls operations of the integrated circuit 100 including any or all of the operations described herein with respect to of the regulator 102, and the bulk voltage generation circuit 104, and so on. The control logic included in the memory may be implemented as a circuit, as one or more programs (e.g., software/firmware) or a combination of circuitry and software. For example, the control logic of the memory may be a processor. According to at least some alternative example embodiments, the operations of the memory may be controlled by an external device. The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor, a multiprocessor, an application-specific integrated circuit (ASIC), a field programmable gate array (FPGA), and so on.

The regulator 102 may be configured to produce an intermediate supply between supply voltages. The supply voltages include an Input/Output (I/O) supply voltage (VDDH), and a core supply voltage (VDD). The I/O Supply voltage is the higher voltage which is used to drive the interface circuits such as buffers and level shifters in a chip. The core supply voltage is typically a lower voltage which is used for circuits that are used for signal processing. In an example, the regulator 102 may be a low-dropout (LDO) regulator, which may regulate an output voltage even when the supply voltage is close to the output voltage.

In an example, the regulator 102 operates in one of an active mode, a power down mode, or a bypass mode. Active Mode means the regulator is in functional mode, where the regulator output voltage is proper, and the regulator provides all the current required by circuits working under it. Power down mode means that the regulator is turned off and the output voltage of the regulator is 0. Bypass mode means the regulator is turned off, but there is a bypass switch which is on and through that switch supply voltage is forced at the regulator output.

The regulator 102 includes a bypass switch 106, which may be configured to bypass the regulator 102 in the bypass mode. In an example, the regulator 102 may be a thick gate P-channel metal-oxide-semiconductor (PMOS) bypass switch with a substrate connection 106a. Embodiments herein use the terms such as "substrate", "substrate connection", and so on, interchangeably through the document.

Figure 2:
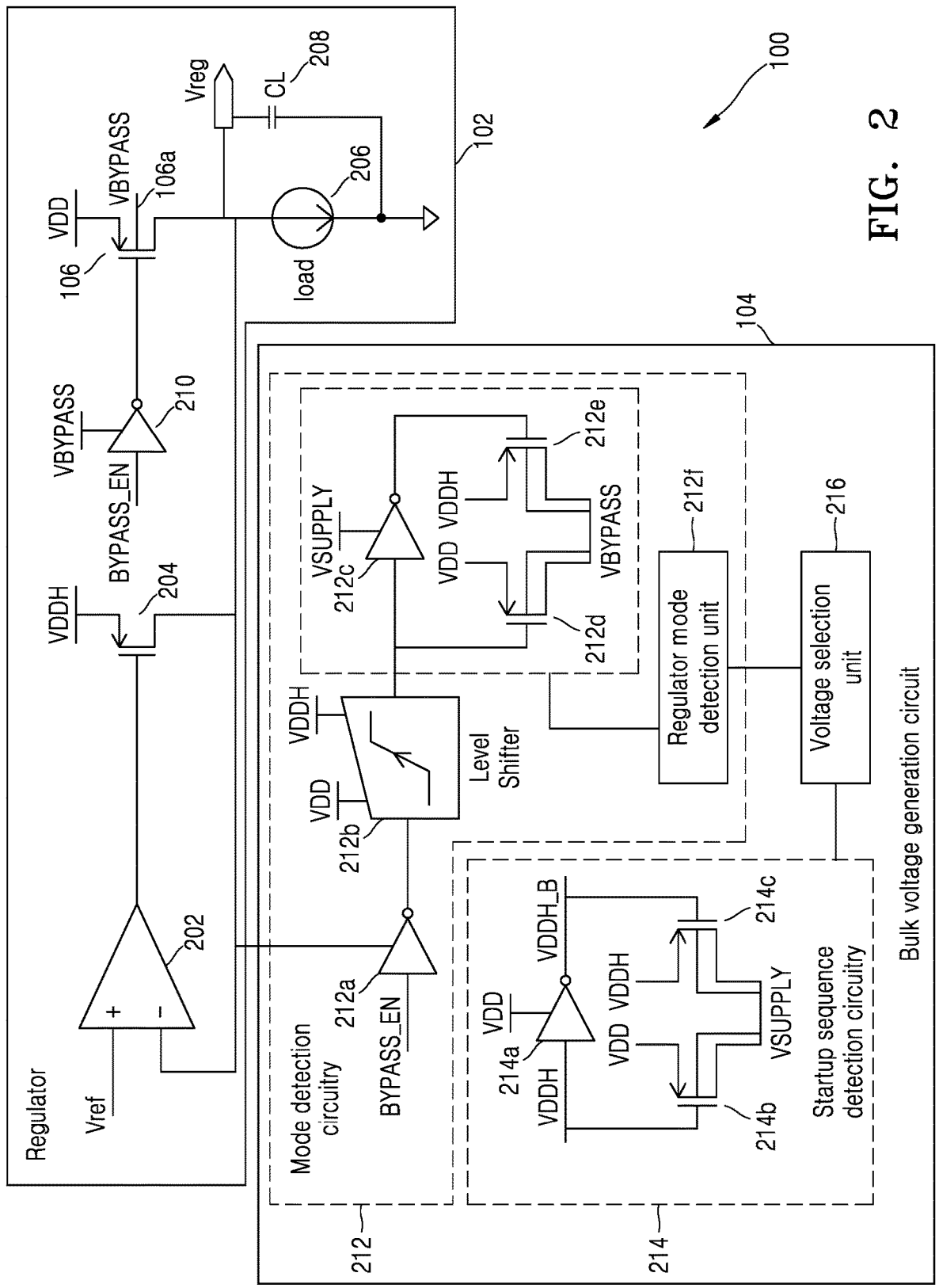
FIG. 2 depicts a circuit diagram of the integrated circuit, according to embodiments as disclosed herein.

The bulk voltage generation circuit 104 may be coupled to the regulator 102 externally. The bulk voltage generation circuit 104 may be configured to select the voltage from the supply voltages for the substrate connection 106a (as depicted in FIG. 2) of the bypass switch 106 for leakage control and overvoltage protection of the bypass switch 106. Thus, resulting in a failsafe implementation of the regulator 102.

In an embodiment, the bulk voltage generation circuit 104 selects the voltage for the substrate connection 106a of the bypass switch 106 based on the mode/mode of operation of the regulator 102, and at least one of a presence or an arrival sequence of the supply voltages. The selected voltage may be used as the substrate connection and also gate control voltage. Based on the mode of the regulator 102, and the supply voltages, the bulk voltage generation circuit 104 may select the highest voltage among the supply voltages that does not cause a reliability issue or device breakdown. Selecting the voltage for the substrate connection 106a of the bypass switch 106 is described in detail in conjunction with FIG. 2.

The bulk voltage generation circuit 104 may also change the voltage of the substrate connection, when the regulator 102 switches from one mode to another mode and/or if one of the supply voltages is not present. The term "and/or" may be used herein to refer to any combination of the listed elements or operations.

FIG. 2 depicts a circuit diagram of the integrated circuit 100, according to embodiments as disclosed herein.

Embodiments herein illustrate the circuit diagram of the regulator 102 by considering the regulator 102 as a PMOS LDO regulator for example, but it will be understood that any other type of regulator may be considered. The regulator 102 includes an amplifier 202, a pass element 204, a variable current source (Iload) 206, a load capacitor 208, a bypass inverter 210, and the bypass switch 106. The pass element 204 may be a PMOS transistor. The pass element 204 includes a source connected to the I/O supply voltage (VDDH), a gate connected to an output voltage of the amplifier 202 (referred hereinafter as an amplifier output voltage), and a drain connected to an output of the regulator 102 (hereinafter referred as a regulator output voltage (Vreg)). The current load 206 represents the net current drawn by all the circuits working under regulator voltage domain. The load capacitor 208 provides a transient current to the circuits working under regulator voltage domain. The load capacitor 208 also stabilizes the regulator. The variable current source 206 and the load capacitor 208 may be on a path of the regulator output voltage. The bypass inverter 210 may be used to operate the bypass switch 106. The bypass inverter 210 operates the bypass switch 106 based on inputs a bypass voltage (Vbypass) and a bypass enable signal (BYPASS_EN) (which may be received from an internal digital circuitry (not shown)). The Vbypass voltage is used as the substrate connection and can be based on the mode of operation. In an embodiment herein, the Vbypass voltage can be at least one of the core supply voltage or the I/O supply voltage. The bypass switch 106 may be implemented as a (thin) gate PMOS bypass switch. The bypass switch 106 includes a source connected to the core supply voltage, a gate connected to an output of the bypass inverter 210, a drain connected to the regulator output voltage, and the substrate/substrate connection 106a. The substrate connection may be connected to one of the I/O supply voltage, or the core supply voltage, based on the mode of the regulator 102 and the supply voltages.

The amplifier 202 may be configured to generate the amplifier output voltage by comparing a reference voltage (Vref) received from a reference voltage generation unit or circuit (not shown), and the regulator output voltage (Vreg). The reference voltage generation unit may be connected externally to the regulator 102. The reference voltage may be used to determine the regulator output voltage. The amplifier 202 provides the generated amplifier output voltage to the pass element 204.

The pass element 204 may be configured to provide the regulator output voltage at an output terminal of the regulator 102 based on the amplifier output voltage and an input voltage (i.e., the core supply voltage). The pass element 204 also controls an intensity of current provided to the output terminal of the regulator 102 based on the amplifier output voltage and the input voltage.

The bypass switch 106 may enabled by the bypass inverter 210 and may be configured to bypass the regulator 102 in the bypass mode.

The bulk voltage generation circuit 104 includes a mode detection circuitry 212, a startup sequence detection circuitry 214, and a voltage selection unit or circuit 216 for selecting one of the supply voltages for the substrate connection of the bypass switch 106 based on the mode of the regulator 102 and the presence and/or the arrival sequence of the supply voltages. The mode detection circuitry 212 may be configured to detect the mode of the regulator 102. The startup sequence detection circuitry 214 may be configured to detect the presence of one of the I/O supply voltage or the core supply voltage, and the arrival sequence of the I/O supply voltage and the core supply voltage.

The mode detection circuitry 212 includes a first inverter 212a, a level shifter 212b, a second inverter 212c, a first PMOS transistor 212d, a second PMOS transistor 212e, and a regulator mode detection unit or circuit 212f for detecting the mode/mode of operation of the regulator 102. The terms first, second, third, etc., may be used herein merely to distinguish one element from another.

The first inverter 212a is configured to receive the bypass enable signal from the internal digital circuitry as an input and the regulator output voltage as a supply. The first inverter 212a may be configured to generate its output voltage (hereinafter referred to as a first inverter output voltage) based on the regulator output voltage. The first inverter 212a generates the first inverter output voltage as zero (i.e., logic low), if the regulator output voltage is zero. The first inverter 212a generates the first inverter output voltage as an inversion of the bypass enable signal if the regulator output voltage is in a core supply domain. The core supply domain can depend on the technology node. In an example herein, the core supply domain can be in the range of, for example, about 0.7V to 0.95V (inclusive). However, it will be understood that the core supply voltage can vary based on technology node and application, and is not limited to the values described by way of example herein. The first inverter output voltage may be provided to the level shifter 212b.

The level shifter 212b coupled to the first inverter 212a may be configured to generate its output voltage (hereinafter referred as a level shifter output voltage) by transforming the first inverter output voltage to an I/O supply domain. The I/O supply domain can depend on the technology node. In an example herein, the I/O supply domain can be in the range of, for example, about 1V to 1.4V (inclusive). However, it will be understood that the I/O supply voltage can vary based on technology node and application, and is not limited to the values described by way of example herein. The level shifter output voltage may be provided to the second inverter 212c.

The second inverter 212c coupled to the level shifter 212b may be configured to generate its output (hereinafter referred as a level shifter output voltage) based on the level shifter output voltage and the presence of one of the I/O supply voltage or the core supply voltage. The second inverter 212c receives information about the presence of the I/O supply voltage or the core supply voltage from the startup sequence detection circuitry 214. The second inverter 212c outputs the second inverter output voltage in the core supply domain, if the I/O supply voltage is zero and the core supply voltage is present. The second inverter 212c outputs the inversion of the level shifter output voltage in the I/O supply domain as the second inverter output voltage, if the I/O supply voltage is present and the core supply voltage is zero.

The first PMOS transistor 212d includes a source connected to the core supply voltage, a gate connected to the input of the second inverter 212c, a drain connected to a drain of the second PMOS transistor, and a substrate, wherein the substrate connection is connected to Vbypass node. The first PMOS transistor 212d may turn ON, if the level shifter output voltage is zero. The first PMOS transistor 212d may be configured to set the bypass voltage as the core supply voltage if the level shifter output voltage is zero.

The second PMOS transistor 212e includes a source connected to the I/O supply voltage, a gate connected to the second inverter output voltage, a drain connected to the drain of the first PMOS transistor 212d, and a substrate, wherein the substrate connection is connected to Vbypass node. The second PMOS transistor 212e may turn ON, if the second inverter output voltage is zero. The second PMOS transistor 212e may be configured to set the bypass voltage as the I/O supply voltage, if the second inverter output voltage is zero.

The regulator mode detection unit 212f may be configured to detect the mode of the regulator 102 based on the bypass voltage set by the first PMOS transistor 212d or the second PMOS transistor 212e and the input of the first inverter 212a. The regulator mode detection unit 212f detects that the regulator 102 is in the active mode if the bypass voltage is the I/O supply voltage. The regulator mode detection unit 212f detects that the regulator 102 is in the bypass mode, if the bypass voltage is the core supply voltage and the input of the first inverter 212a is high (i.e., logic high). The regulator mode detection unit 212f detects that the regulator 102 is in the power down mode if the bypass voltage is in the core supply voltage domain and the input of the first inverter is zero.

The startup sequence detection circuitry 214 includes a third inverter 214a, a third PMOS transistor 214b, and a fourth PMOS transistor 214c for detecting the presence and the arrival sequence of the I/O supply voltage and the core supply voltage.

The power up sequence is how both the supplies comes up. Initially, the core supply comes up first and the I/O supply is not there. Irrespective of Bypass_EN, the output of the level shifter will be 0. Also, Vsupply will be pulled to core supply. Hence the output of the inverter 212c will be pulled to the core supply voltage. Hence, Vbypass will be pulled to the core supply and any possible scenario of the back current is avoided. As soon as the I/O supply is up, Vsupply will be pulled to I/O supply. Then, based on the mode, the Vbypass node will be pulled to either core supply or I/O supply and hence, both reliability and leakage issues may be addressed.

The third inverter 214a comprises the I/O supply voltage and the core supply voltage as inputs. The third inverter 214a may be configured to generate its output (hereinafter referred as a third inverter output voltage) as an inversion of the I/O supply voltage in the core supply voltage domain.

The third PMOS transistor 214b includes a source connected to the core supply voltage, a gate connected to the I/O supply voltage (i.e., one of the inputs of the third inverter 214a), a drain connected to a drain of the fourth PMOS transistor 214c, and a substrate, wherein the substrate connection is connected to Vsupply node. The third PMOS transistor 214b may turn ON, if the I/O supply voltage is zero. The third PMOS transistor 214b may be configured to set the supply voltage as the core supply voltage (indicating the presence of the core supply voltage), if the I/O supply voltage is zero.

The fourth PMOS transistor 214c includes a source connected to the I/O supply voltage, a gate connected to the third inverter output voltage, the drain connected to the drain of the third PMOS transistor 214b, and a substrate, wherein the substrate connection is connected to Vsupply node. The fourth PMOS transistor 214c may turn ON, if the I/O supply voltage is present. The fourth PMOS transistor 214c be configured to set the supply voltage as the I/O supply voltage (indicating the presence of the I/O supply voltage), if the I/O supply voltage is present.

The voltage selection unit 216 may be configured to select the voltage from the I/O supply voltage or the core supply voltage (i.e., the supply voltages) for the substrate connection 106a of the bypass switch 106 based on the mode of the regulator 102 and the presence/arrival sequence of the I/O supply voltage and the core supply voltage. The voltage selection unit 216 selects the I/O supply voltage for the substrate connection 106a of the bypass switch 106, on detecting that the regulator 102 is in the active mode and detecting the presence of the I/O supply voltage. The voltage selection unit 216 selects the core supply voltage for the substrate connection 106a of the bypass switch 106, when the arrival sequence of the core supply voltage is before the I/O supply voltage. The voltage selection unit 216 selects the core supply voltage for the substrate connection 106a of the bypass switch 106, on detecting that the regulator 102 is in the power down mode or the bypass mode and detecting the presence of both the I/O supply voltage and the core supply voltage. Thus, selecting the voltage for the substrate connection 106a of the bypass switch 106 controls the leakage and protects the overvoltage of the bypass switch 106.

FIGS. 1 and 2 show example components of the integrated circuit 100, but it is to be understood that other embodiments are not limited thereon. In other embodiments, the integrated circuit 100 may include fewer or more of components in number. Further, the labels or names of the components are used only for illustrative purposes and does not limit the scope of the embodiments herein. One or more components can be combined together to perform same or substantially similar function in the integrated circuit 100.

Figure 3:
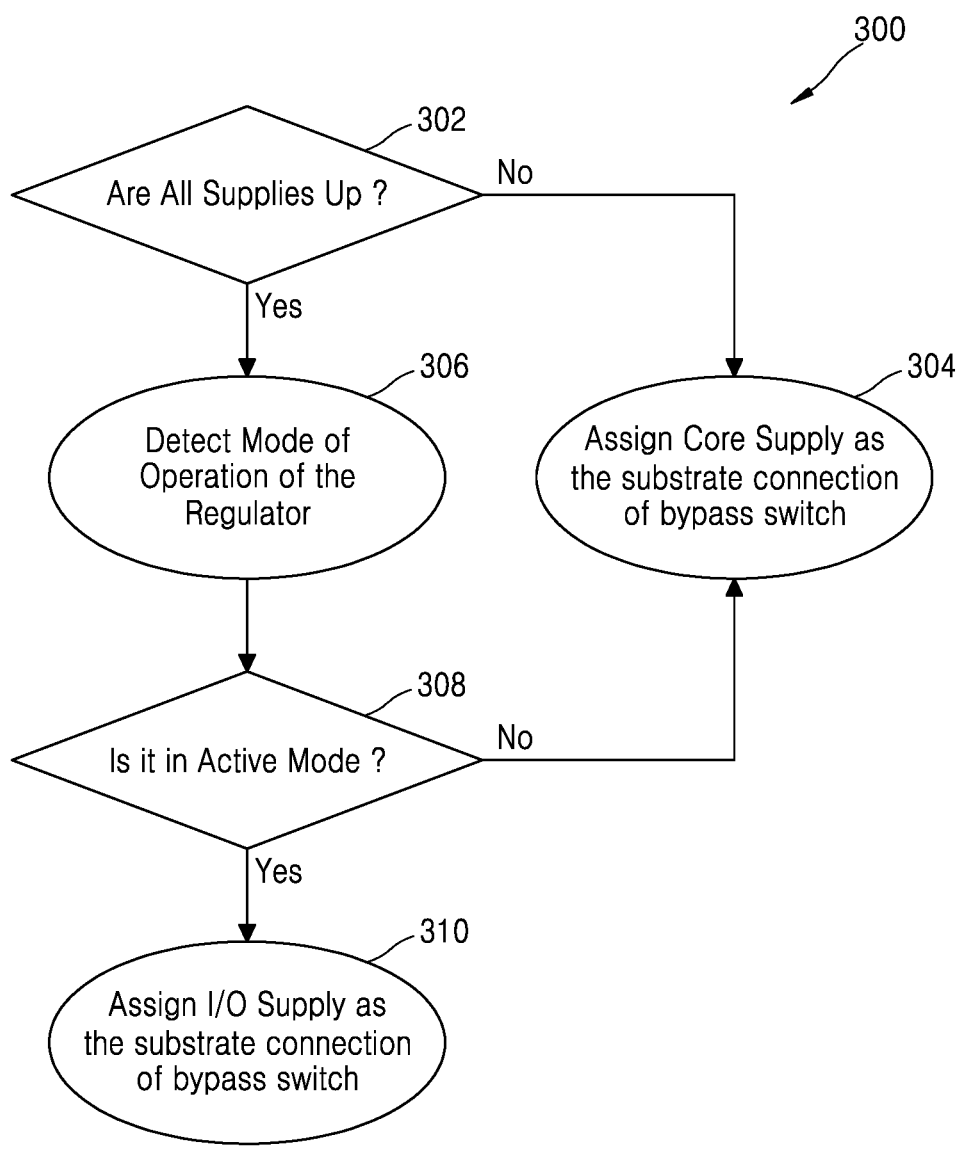
FIG. 3 is an example flow diagram depicting selection of a voltage for a substrate connection of a bypass switch of the regulator, according to embodiments as disclosed herein.

FIG. 3 is an example flow diagram 300 depicting selection of the voltage for the substrate connection 106a of the bypass switch 106 of the regulator 102, according to embodiments as disclosed herein.

Figure 4:
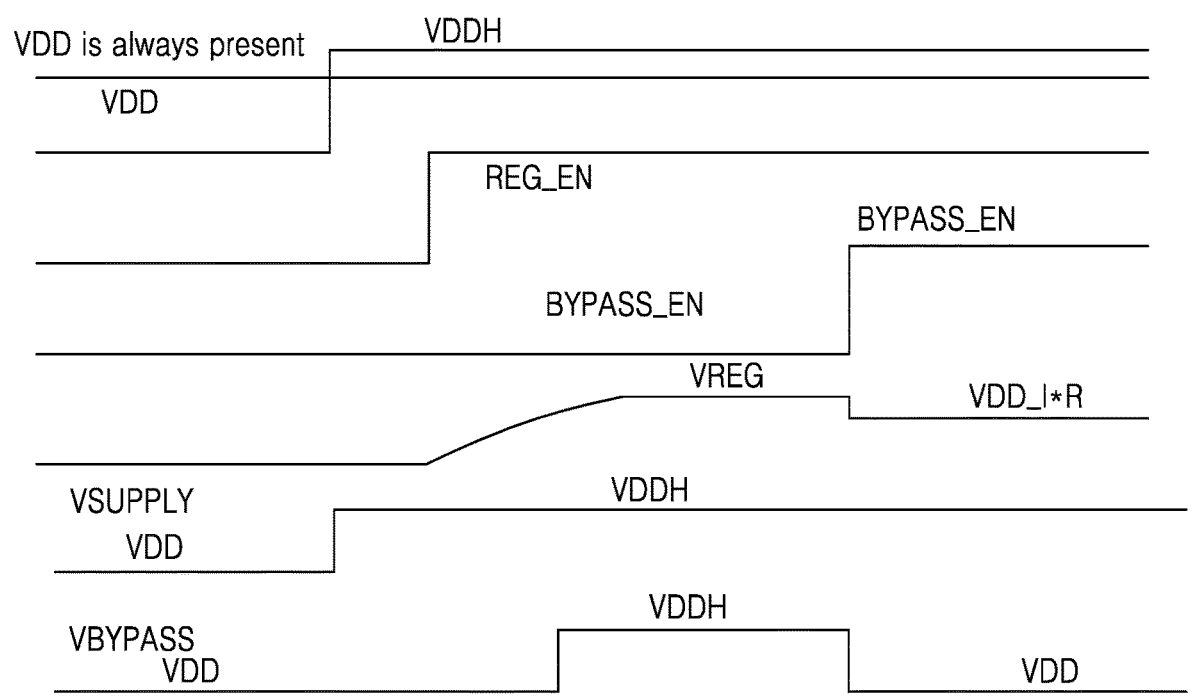
FIG. 4 depicts an example waveform depicting an Input/Output (I/O) supply voltage (VDDH) and a core supply voltage (VDD), according to embodiments as disclosed herein.

At step 302, the bulk voltage generation circuit 104 detects whether all the supply voltages are up/present. The supply voltages include the I/O supply voltage (VDDH) and the core supply voltage (VDD). An example waveform depicting the I/O supply voltage (VDDH) and the core supply voltage (VDD) is depicted in FIG. 4.

If all the supply voltages are not present, at step 304, the bulk voltage generation circuit 104 selects/assigns the core supply voltage for the substrate connection 106a of the bypass switch 106 in the regulator 102.

If all the supply voltages are present, at step 306, the bulk voltage generation circuit 104 detects the mode of the regulator 102. At step 308, the bulk voltage generation circuit 104 checks if the regulator 102 is in the active mode.

If the regulator is not in the active mode, the step 304 may be performed by the bulk voltage generation circuit 104 to select the core supply voltage for the substrate connection 106a of the bypass switch 106 in the regulator 102.

If the regulator is in the active mode, at step 310, the bulk voltage generation circuit 104 selects/assigns the I/O supply voltage for the substrate connection 106a of the bypass switch 106 in the regulator 102. The various actions in method 300 may be performed in the order presented, in a different order or simultaneously. Further, in some embodiments, some actions listed in FIG. 3 may be omitted.

Figure 5:
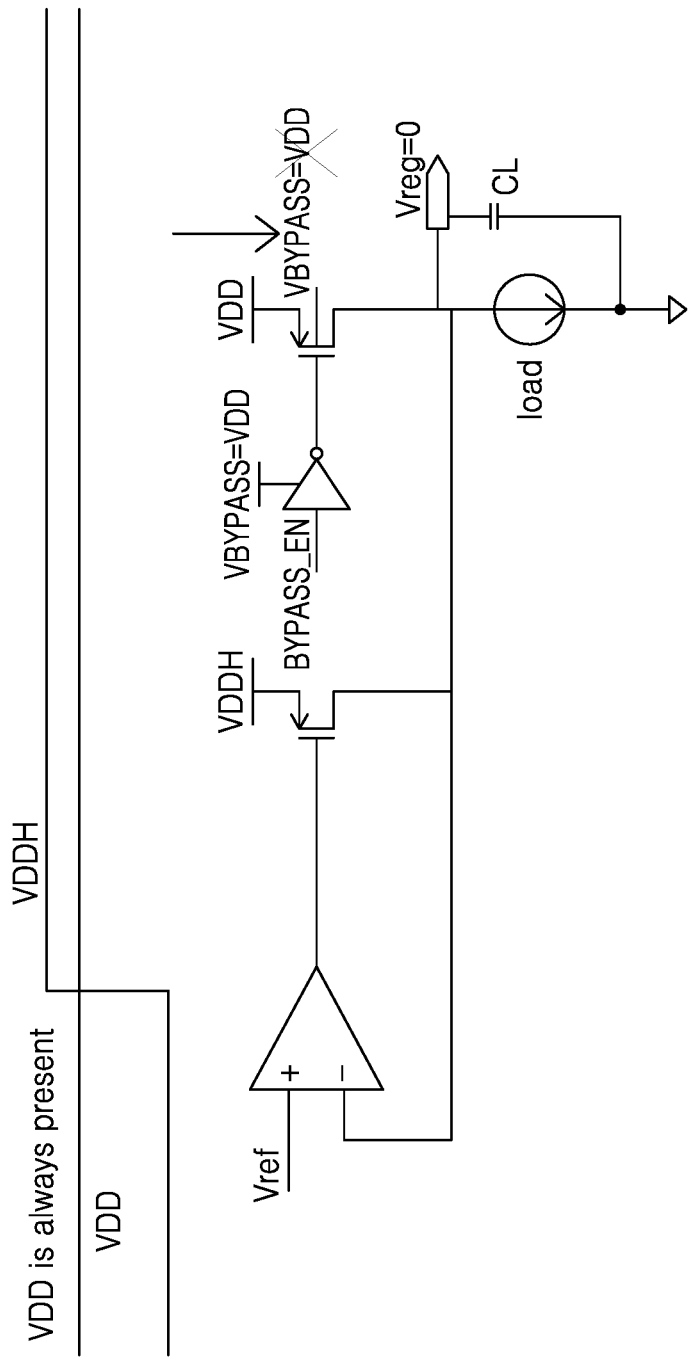
FIG. 5 is an example diagram illustrating the selection of the voltage for the substrate connection of the bypass switch, according to embodiments as disclosed herein.

FIG. 5 is an example diagram illustrating the selection of the voltage for the substrate connection 106a of the bypass switch 106, according to embodiments as disclosed herein. In an embodiment, the integrated circuit 100 comprises the bulk voltage generation circuit 104 externally coupled to the regulator 102. The bulk voltage generation circuit 104 aids in fail-safe implementation of the regulator 102 through controlling the selection of the voltage for the substrate connection 106a of the bypass switch 106 of the regulator 102. The bulk voltage generation circuit 104 selects the voltage for the substrate connection 106a of the bypass switch 106 based on the mode of the regulator 102 and the presence/arrival sequence of the I/O supply voltage and the core supply voltage. Thus, controlling the selection of the voltage for the substrate connection 106a of the bypass switch 106 can eliminate cross supply current between the I/O supply voltage and the core supply voltage.

Figure 6A:
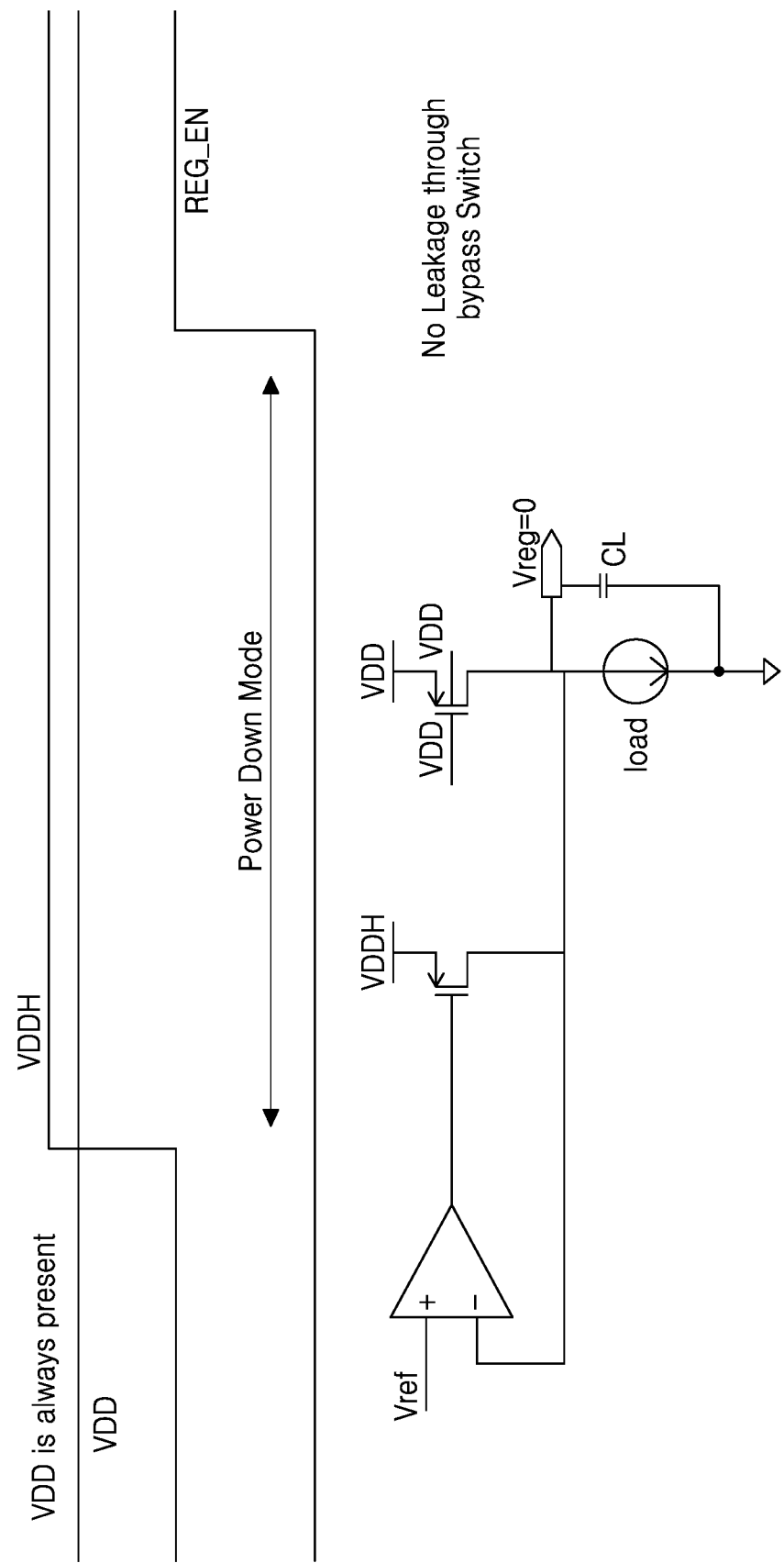
FIGS. 6a, 6b, and 6c are example diagrams illustrating the selection of the voltage for the substrate connection of the bypass switch across the various modes of the regulator, according to embodiments as disclosed herein.
Figure 6B:
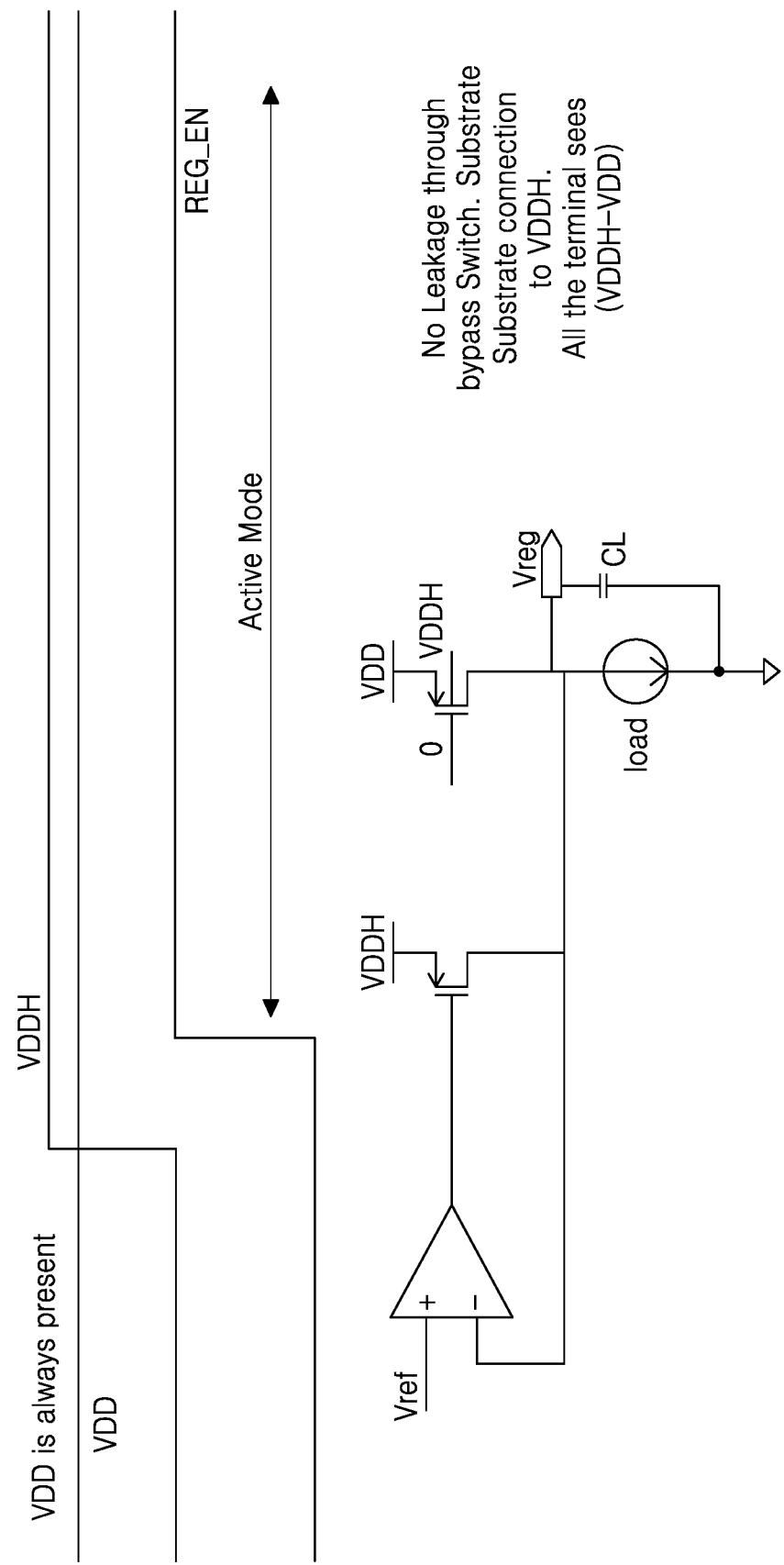
Figure 6C:
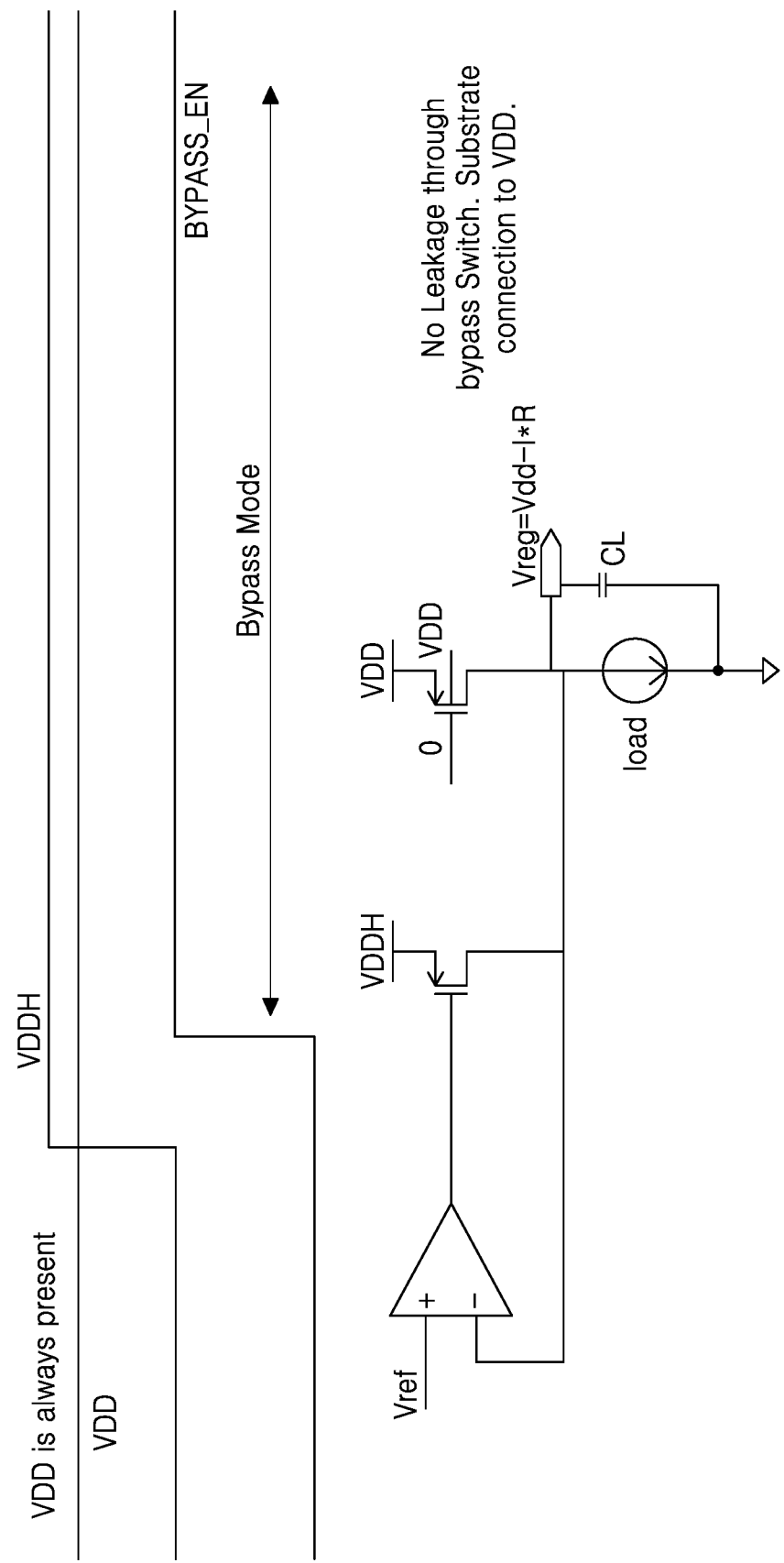

FIGS. 6a, 6b, and 6c are example diagrams illustrating the selection of the voltage for the substrate connection 106a of the bypass switch 106 across the various modes of the regulator 102, according to embodiments as disclosed herein.

Consider an example scenario, as depicted in FIG. 6a, wherein the regulator 102 is in the power down mode. In such a scenario, the bulk voltage generation circuit 104 selects the core supply voltage (VDD) for the substrate connection 106a of the bypass switch 106 of the regulator 102, thereby resulting in little to no leakage in the bypass switch 106.

Consider another example scenario, as depicted in FIG. 6b, wherein the regulator 102 is in the active mode. In such a scenario, the bulk voltage generation circuit 104 detects the presence of and selects the I/O supply voltage (VDDH) for the substrate connection 106a of the bypass switch 106 of the regulator 102, thereby resulting in little to no leakage in the bypass switch 106 and all the terminals of the regulator 102 may have the voltage of (VDDH-VDD).

Consider another example scenario, as depicted in FIG. 6c, wherein the regulator 102 is in the bypass mode. In such a scenario, the bulk voltage generation circuit 104 selects the core supply voltage (VDD) for the substrate connection 106a of the bypass switch 106 of the regulator 102, thereby resulting in little to no leakage in the bypass switch 106.

Figure 7:
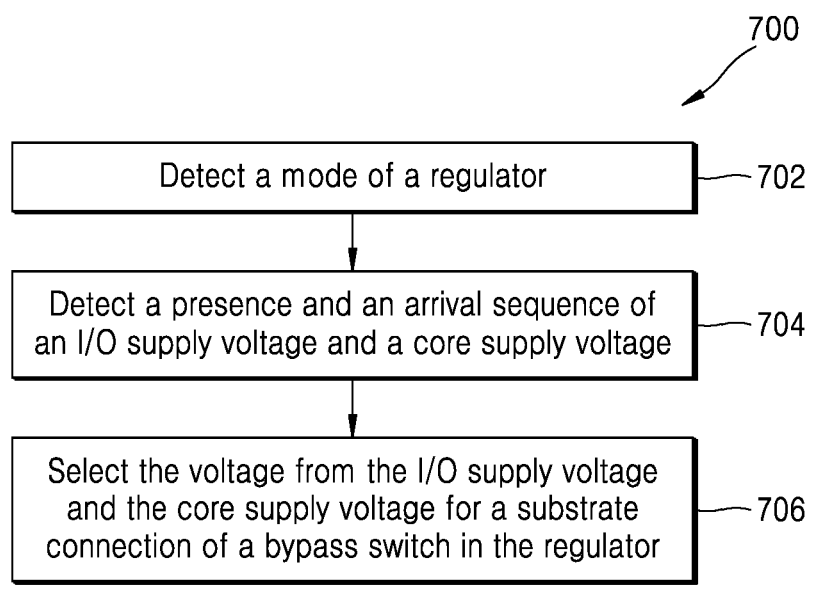
FIG. 7 is a flow chart depicting a method for selecting the voltage for the substrate connection of the bypass switch in the regulator, according to embodiments as disclosed herein.

FIG. 7 is a flow chart 700 depicting a method for selecting the voltage for the substrate connection 106a of the bypass switch 106 in the regulator 102, according to embodiments as disclosed herein.

At step 702, the method includes detecting, by the bulk voltage generation circuit 104, the mode of the regulator 102. At step 704, the method includes detecting, by the bulk voltage generation circuit 104, the presence and the arrival sequence of the I/O supply voltage and the core supply voltage.

At step 706, the method includes selecting, by the bulk voltage generation circuit 104, the voltage (from among the I/O supply voltage and the core supply voltage) for the substrate connection 106a of the bypass switch 106 in the regulator 102. The various actions in method 700 may be performed in the order presented, in a different order or simultaneously. Further, in some embodiments, some actions listed in FIG. 7 may be omitted.

Figure 8:
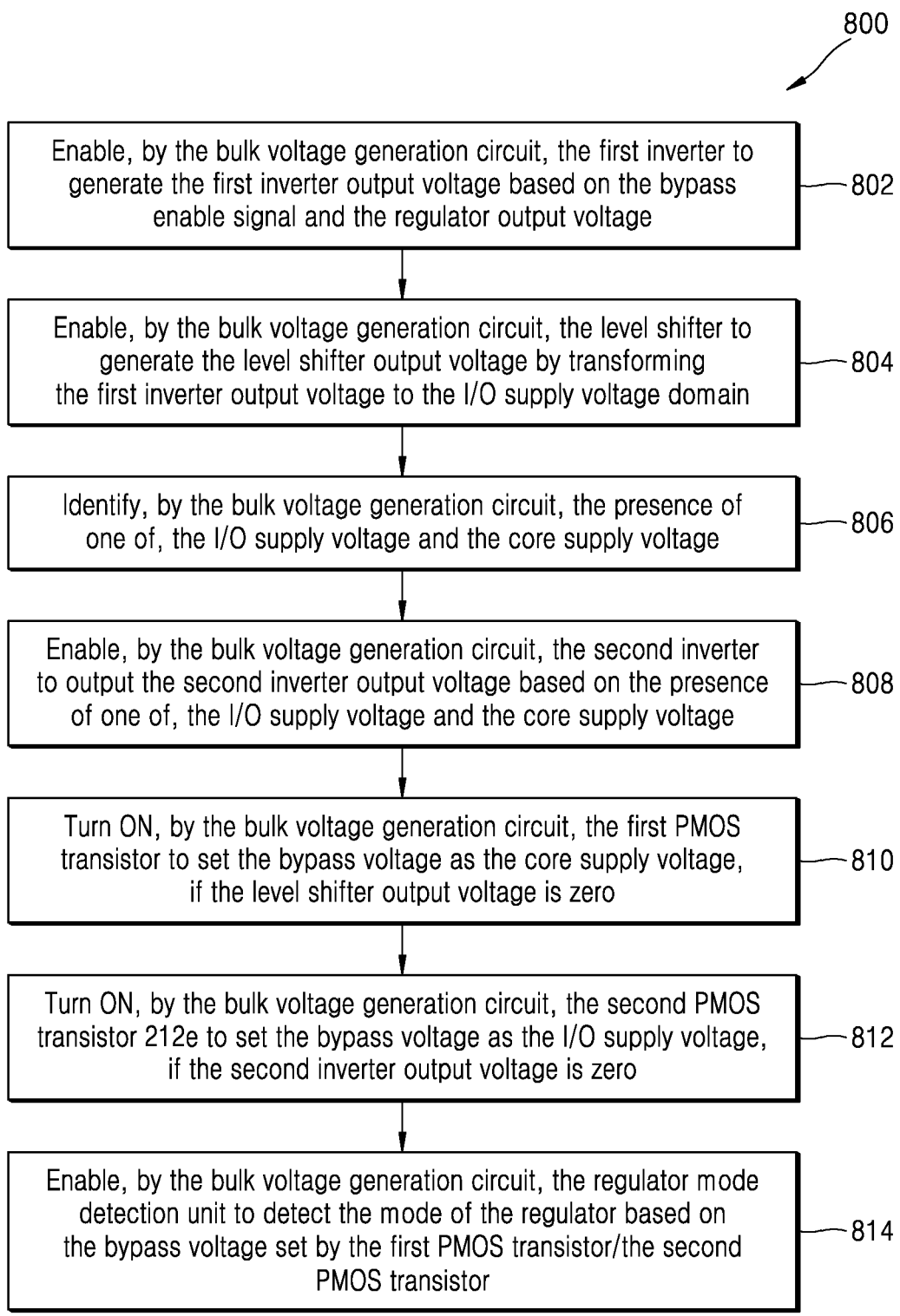
FIG. 8 is a flow chart depicting a method for detecting a mode of operation of the regulator, according to embodiments as disclosed herein.

FIG. 8 is a flow chart 800 depicting a method for detecting the mode of operation of the regulator 102, according to embodiments as disclosed herein.

At step 802, the method includes enabling, by the bulk voltage generation circuit 104, the first inverter 212a to generate the first inverter output voltage based on the bypass enable signal and the regulator output voltage. The first inverter output voltage may be zero if the output of the regulator is zero. The first inverter output voltage may be the inversion of the bypass enable signal if the regulator output voltage is in the core supply voltage domain.

At step 804, the method includes enabling, by the bulk voltage generation circuit 104, the level shifter 212b to generate the level shifter output voltage by transforming the first inverter output voltage to the I/O supply voltage domain.

At step 806, the method includes identifying, by the bulk voltage generation circuit 104, the presence of one of the I/O supply voltage or the core supply voltage.

At step 808, the method includes enabling, by the bulk voltage generation circuit 104, the second inverter 212c to output the second inverter output voltage based on the presence of one of the I/O supply voltage or the core supply voltage. The second inverter output may be in the core supply voltage domain, if the I/O supply voltage is zero and the core supply voltage is present. The second inverter output voltage may be the inversion of the level shifter output voltage in the I/O supply voltage domain, if the I/O supply voltage is present and the core supply voltage is zero.

At step 810, the method includes turning ON, by the bulk voltage generation circuit 104, the first PMOS transistor 212d to set the bypass voltage as the core supply voltage, if the level shifter output voltage is zero.

At step 812, the method includes turning ON, by the bulk voltage generation circuit 104, the second PMOS transistor 212e to set the bypass voltage as the I/O supply voltage, if the second inverter output voltage is zero.

At step 814, the method includes enabling, by the bulk voltage generation circuit 104, the regulator mode detection unit or circuit 212f to detect the mode of the regulator 102 based on the bypass voltage set by the first PMOS transistor 212d/the second PMOS transistor 212e. The regulator mode detection unit 212f detects that the regulator 102 is in the active mode if the bypass voltage is the I/O supply voltage. The regulator mode detection unit 212f detects that the regulator 102 is in the bypass mode if the bypass voltage is the core supply voltage and the input of the first inverter 212a is high. The regulator mode detection unit 212f detects that the regulator 102 is in the power down mode if the bypass voltage is in the core supply voltage domain and the input of the first inverter 212a is zero. The various actions in method 800 may be performed in the order presented, in a different order or simultaneously. Further, in some embodiments, some actions listed in FIG. 8 may be omitted.

Figure 9:
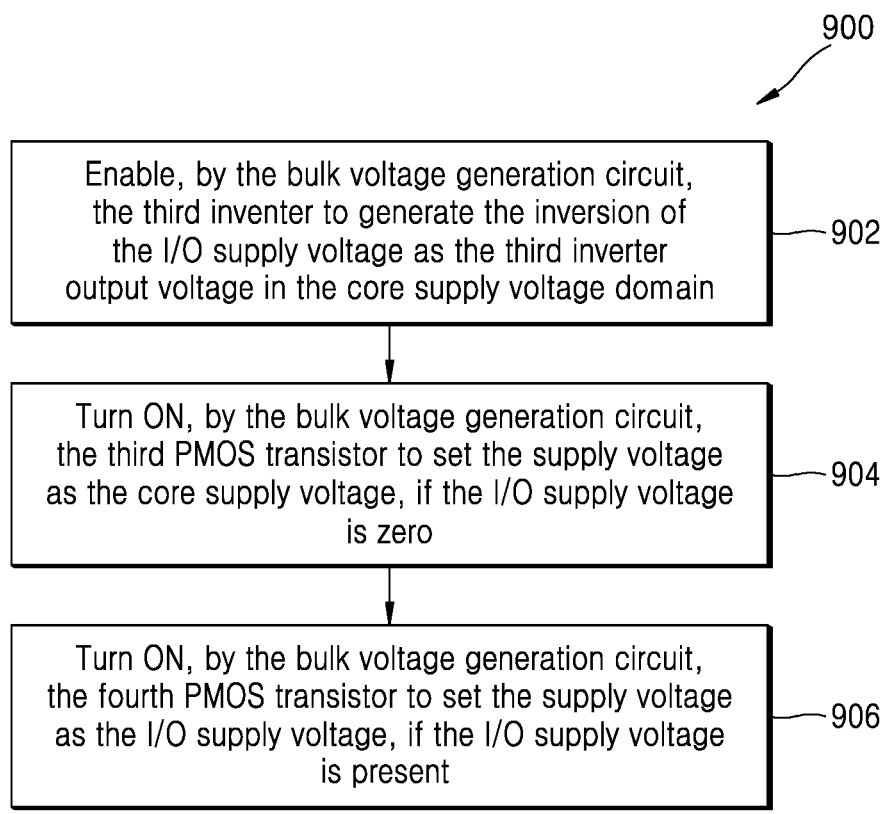
FIG. 9 is a flow chart depicting a method for detecting a presence and an arrival sequence of the I/O supply voltage and the core supply voltage, according to embodiments as disclosed herein.

FIG. 9 is a flow chart 900 depicting a method for detecting the presence and the arrival sequence of the I/O supply voltage and the core supply voltage, according to embodiments as disclosed herein.

At step 902, the method includes enabling, by the bulk voltage generation circuit 104, the third inverter 214a to generate the inversion of the I/O supply voltage as the third inverter output voltage in the core supply voltage domain. At step 904, the method includes turning ON, by the bulk voltage generation circuit 104, the third PMOS transistor 214b to set the supply voltage as the core supply voltage, if the I/O supply voltage is zero, thus indicating the presence of the core supply voltage or the absence of the I/O supply voltage. At step 906, the method includes turning ON, by the bulk voltage generation circuit 104, the fourth PMOS transistor 214c to set the supply voltage as the I/O supply voltage, if the I/O supply voltage is present, thus indicating the presence of the I/O supply voltage. The various actions in method 900 may be performed in the order presented, in a different order or simultaneously. Further, in some embodiments, some actions listed in FIG. 9 may be omitted.

Figure 10:
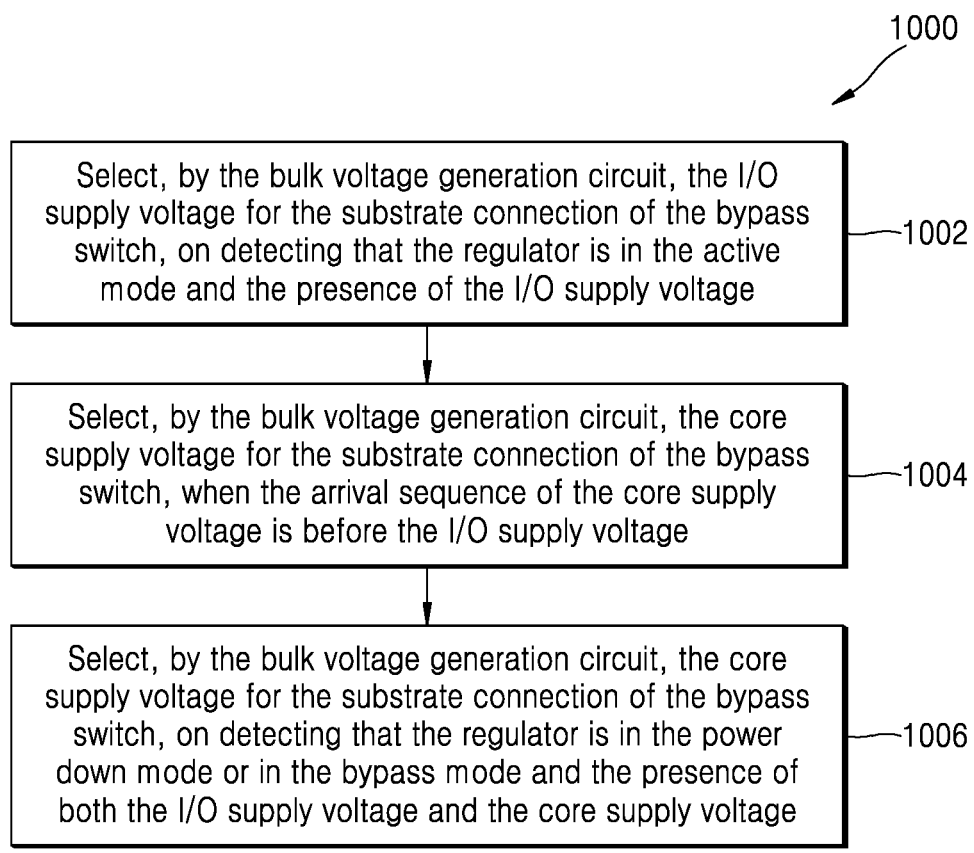
FIG. 10 is a flow chart depicting a method for selecting the voltage for the substrate connection of the bypass switch based on the mode of operation of the regulator and supply voltages, according to embodiments as disclosed herein.

FIG. 10 is a flow chart 1000 depicting a method for selecting the voltage for the substrate connection 106a of the bypass switch 106 based on the mode of operation of the regulator 102 and the supply voltages, according to embodiments as disclosed herein.

At step 1002, the method includes selecting, by the bulk voltage generation circuit 104, the I/O supply voltage for the substrate connection 106a of the bypass switch 106, on or responsive to detecting that the regulator 102 is in the active mode and detecting the presence of the I/O supply voltage.

At step 1004, the method includes selecting, by the bulk voltage generation circuit 104, the core supply voltage for the substrate connection 106a of the bypass switch 106, when the arrival sequence of the core supply voltage is before the I/O supply voltage.

At step 1006, the method includes selecting, by the bulk voltage generation circuit 104, the core supply voltage for the substrate connection 106a of the bypass switch 106, on or responsive to detecting that the regulator 102 is in the power down mode or in the bypass mode and detecting the presence of both the I/O supply voltage and the core supply voltage. The various actions in method 1000 may be performed in the order presented, in a different order or simultaneously. Further, in some embodiments, some actions listed in FIG. 10 may be omitted.

Embodiments herein disclose a bulk voltage generation circuit externally coupled to a regulator configured to:

detect a mode of operation of the regulator (active/power down/bypass) and a power sequence (i.e., an arrival sequence of supply voltages/power supplies);

detect a highest voltage (among the supply voltages) that does not cause a reliability issue or device break down for a substrate connection of a bypass switch of the regulator based on the mode of operation of the regulator and the supply voltages. When the regulator is in an active mode and a regulator output voltage comes up, an I/O supply voltage is selected for the substrate connection of a bypass switch of the regulator. In the active mode, though an absolute value of the I/O supply voltage is high, a voltage realized between any two terminals of a thin gate device is well within reliability time. When the regulator is a power down mode or a bypass mode, a core supply voltage is selected for the substrate connection of a bypass switch of the regulator. The selected voltage may be used as the substrate connection and a gate control voltage; and change the substrate connection when the regulator switches from one mode to another or if one of the supply voltages is not present.

Thus, controlling the selection of the voltage for the substrate connection of the bypass switch of the regulator may be an elegant solution for a fail-safe mechanism of the regulator with leakage prevention (during powerup) and lower area and without supply sequencing constraint.

The embodiments disclosed herein can be implemented through at least one software program running on at least one hardware device and performing network management functions to control the elements. The elements shown in FIGS. 1 and 2 can be at least one of a hardware device, or a combination of hardware device and software module.

More generally, embodiments are described and illustrated in the drawings in terms of functional blocks, units and/or modules. Those skilled in the art will appreciate that these blocks, units and/or modules can be physically implemented by electronic circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein can be practiced with modification within the scope of the embodiments as described herein.

That which is claimed is:

1. An integrated circuit comprising:
a regulator comprising a bypass switch and configured to provide a regulator output voltage; and
a bulk voltage generation circuit coupled to the regulator, wherein the bulk voltage generation circuit is configured to select, among a plurality of supply voltages that are different than the regulator output voltage, a voltage for a substrate connection of the bypass switch based on a mode of operation of the regulator and an arrival sequence of the supply voltages.

2. The integrated circuit of claim 1, wherein the supply voltages comprise an Input/Output (I/O) supply voltage and a core supply voltage.

3. The integrated circuit of claim 1, wherein the bypass switch is configured to bypass the regulator in a bypass mode, wherein the bypass switch is a P-channel metal-oxide-semiconductor (PMOS) bypass switch.

4. The integrated circuit of claim 2, wherein the bulk voltage generation circuit comprises:
mode detection circuitry configured to detect the mode of operation of the regulator; and
startup sequence detection circuitry configured to:
detect a presence of one of the I/O supply voltage or the core supply voltage; and
detect the arrival sequence of the I/O supply voltage and the core supply voltage.

5. The integrated circuit of claim 4, wherein the mode of operation of the regulator is one of an active mode, a power down mode, or a bypass mode.

6. The integrated circuit of claim 5, wherein the mode detection circuitry comprises:
a first inverter configured to receive a bypass enable signal from an internal digital circuitry as an input and the regulator output voltage as a supply, generate a first inverter output voltage as zero if the regulator output voltage is zero, and generate an inversion of the bypass enable signal as the first inverter output voltage if the regulator output voltage is in a core supply voltage domain;
a level shifter coupled to the first inverter and configured to generate a level shifter output voltage by transforming the first inverter output voltage to an I/O supply voltage domain;

a second inverter coupled to the level shifter and configured to receive the level shifter output voltage and information about the presence of one of the I/O supply voltage or the core supply voltage from the startup sequence detection circuitry, output a second inverter output voltage in the core supply voltage domain if the I/O supply voltage is zero and the core supply voltage is present, and output an inversion of the level shifter output voltage in the I/O supply voltage domain as the second inverter output voltage if the I/O supply voltage is present and the core supply voltage is zero;

a first PMOS transistor configured to set a bypass voltage as the core supply voltage if the level shifter output voltage is zero; and a second PMOS transistor configured to set the bypass voltage as the I/O supply voltage if the second inverter output voltage is zero.

7. The integrated circuit of claim 6, wherein the mode detection circuitry further comprises a regulator mode detection circuit configured to:

detect that the regulator is in the active mode if the bypass voltage is the I/O supply voltage;

detect that the regulator is in the bypass mode if the bypass voltage is the core supply voltage and the input of the first inverter is high; and detect that the regulator is in the power down mode if the bypass voltage is in the core supply voltage domain and the input of the first inverter is zero.

8. The integrated circuit of claim 4, wherein the startup sequence detection circuitry comprises:

a third inverter configured to generate an inversion of the I/O supply voltage as a third inverter output voltage in a core supply voltage domain;

a third PMOS transistor configured to set a supply voltage as the core supply voltage if the I/O supply voltage is zero; and a fourth PMOS transistor coupled to the third inverter and the third PMOS transistor and configured to set the supply voltage as the I/O supply voltage if the I/O supply voltage is present.

9. The integrated circuit of claim 2, wherein the bulk voltage generation circuit further comprises a voltage selection circuit configured to:

select the I/O supply voltage for the substrate connection of the bypass switch, responsive to detecting that the regulator is in an active mode and a presence of the I/O supply voltage;

select the core supply voltage for the substrate connection of the bypass switch, when the arrival sequence of the core supply voltage is before the I/O supply voltage; and select the core supply voltage for the substrate connection of the bypass switch, responsive to detecting that the regulator is in a power down mode or in a bypass mode and the presence of both the I/O supply voltage and the core supply voltage.

10. The method of claim 9, wherein the selecting the voltage is based on the mode of operation of the regulator and the arrival sequence in which one of the supply voltages arrives before another of the supply voltages.

11. A method for selecting a voltage for a substrate connection of a bypass switch in a regulator that is configured to provide a regulator output voltage, the method comprising;

selecting, by a bulk voltage generation circuit coupled to the regulator and from among a plurality of supply voltages that are different than the regulator output voltage, the voltage for the substrate connection of the bypass switch based on a mode of operation of the regulator and at least one of a presence or an arrival sequence of the supply voltages.

12. The method of claim 11, wherein the supply voltages comprise an Input/Output (I/O) supply voltage and a core supply voltage.

13. The method of claim 12, wherein the mode of operation of the regulator is one of an active mode, a power down mode, or a bypass mode.

14. The method of claim 13, further comprising detecting, by the bulk voltage generation circuit, the mode of operation of the regulator by:

enabling a first inverter to generate a first inverter output voltage based on a bypass enable signal and the regulator output voltage, wherein the first inverter output voltage is zero if the regulator output voltage is zero, and the first inverter output voltage is an inversion of the bypass enable signal if the regulator output voltage is in a core supply voltage domain;

enabling a level shifter to generate a level shifter output voltage by transforming the first inverter output voltage to a I/O supply voltage domain;

identifying a presence of one of the I/O supply voltage or the core supply voltage;

enabling a second inverter to output a second inverter output voltage based on the presence of the one of the I/O supply voltage or the core supply voltage, wherein the second inverter output voltage is in the core supply voltage domain if the I/O supply voltage is zero and the core supply voltage is present, and the second inverter output voltage is an inversion of the level shifter output voltage in the I/O supply voltage domain if the I/O supply voltage is present and the core supply voltage is zero;

controlling a first PMOS transistor to set a bypass voltage as the core supply voltage if the level shifter output voltage is zero; and controlling a second PMOS transistor to set the bypass voltage as the I/O supply voltage if the second inverter output voltage is zero.

15. The method of claim 14, further comprising:

detecting that the regulator is in the active mode if the bypass voltage is the I/O supply voltage;

detecting that the regulator is in the bypass mode if the bypass voltage is the core supply voltage and an input of the first inverter is high; and detecting that the regulator is in the power down mode if the bypass voltage is in the core supply voltage domain and the input of the first inverter is zero.

16. The method of claim 12, further comprising detecting, by the bulk voltage generation circuit, a presence and the arrival sequence of the I/O supply voltage and the core supply voltage by:

enabling a third inverter to generate an inversion of the I/O supply voltage as a third inverter output voltage in a core supply voltage domain controlling a third PMOS transistor to set a supply voltage as the core supply voltage if the I/O supply voltage is zero; and controlling a fourth PMOS transistor to set the supply voltage as the I/O supply voltage if the I/O supply voltage is present.

17. The method of claim 13, wherein the selecting, by the bulk voltage generation circuit, the voltage for the substrate connection of the bypass switch comprises:

selecting the I/O supply voltage for the substrate connection of the bypass switch, responsive to detecting that the regulator is in the active mode and a presence of the I/O supply voltage;

selecting the core supply voltage for the substrate connection of the bypass switch (106), when the arrival sequence of the core supply voltage is before the I/O supply voltage; and selecting the core supply voltage for the substrate connection of the bypass switch, responsive to detecting that the regulator is in the power down mode or in the bypass mode and the presence of both the I/O supply voltage and the core supply voltage.

18. The integrated circuit of claim 1, wherein the bulk voltage generation circuit is configured to select the voltage based on the mode of operation of the regulator and the arrival sequence in which one of the supply voltages arrives before another of the supply voltages.

19. An integrated circuit comprising:

a regulator comprising a bypass switch having a substrate connection; and a bulk voltage generation circuit coupled to the regulator and configured to select, among a plurality of supply voltages, a higher voltage for the substrate connection of the bypass switch responsive to detecting a presence of the higher voltage and an active mode of operation of the regulator, wherein the higher voltage is greater than a core supply voltage among the plurality of supply voltages, and wherein the bulk voltage generation circuit is configured to select the core supply voltage for the substrate connection of the bypass switch responsive to detecting one of:

arrival of the core supply voltage before the higher voltage; or a power down mode or a bypass mode of operation of the regulator and a presence of both the higher voltage and the core supply voltage.

20. The integrated circuit of claim 19, wherein the higher voltage is an Input/Output (I/O) supply voltage.

\* \* \* \* \*